(12) United States Patent
Catalano et al.

(10) Patent No.: US 8,370,718 B2
(45) Date of Patent: Feb. 5, 2013

(54) METHOD FOR IDENTIFYING A FLASH MEMORY DEVICE AND RELATED HOSTING DEVICE

(75) Inventors: Dario Catalano, Milan (IT); Massimo De Martino, Ercolano (IT)

(73) Assignee: STMicroelectronics S.R.L., Agrate Brianza (MB) (IT)

( * ) Notice: Subject to any disclaimer, the term of this patent is extended or adjusted under 35 U.S.C. 154(b) by 962 days.

(21) Appl. No.: 12/420,541

(22) Filed: Apr. 8, 2009

(65) Prior Publication Data

US 2010/0262891 A1  Oct. 14, 2010

(51) Int. Cl.
G06F 11/00 (2006.01)
(52) U.S. Cl. ......................................................... 714/773
(58) Field of Classification Search .................. 714/773
See application file for complete search history.

(56) References Cited

U.S. PATENT DOCUMENTS

| | | | |
|---|---|---|---|
| 2006/0143368 A1* | 6/2006 | Lasser et al. | 711/103 |
| 2007/0061498 A1* | 3/2007 | Chua et al. | 711/103 |
| 2008/0288715 A1* | 11/2008 | Maddali et al. | 711/103 |

* cited by examiner

*Primary Examiner* — Scott Baderman
*Assistant Examiner* — Jigar Patel
(74) *Attorney, Agent, or Firm* — Allen, Dyer, Doppelt, Milbrath & Gilchrist, P.A.

(57) ABSTRACT

A method is for identifying a flash memory device coupled to a host device. The flash memory device may have a page size from possible page sizes, bootstrap code stored on a first sector thereof, and a data bus for accessing data stored in the flash memory device and with a data bus size from possible data bus sizes. The method may include reading data stored in a first page of the first sector as if the flash memory device had an assumed page size and an assumed data bus size, and reading content from memory locations where error correction code (ECC) bytes of the first page are stored if the flash memory device has the assumed page size and checking whether the ECC bytes include more than a number of errors associated with the assumed page size. The method may also include if the ECC bytes do not include more than the number of errors, generating a flag signal that the flash memory device has the assumed page size and the assumed data bus size.

22 Claims, 7 Drawing Sheets

METHOD FOR IDENTIFYING A FLASH MEMORY DEVICE AND RELATED HOSTING DEVICE

FIELD OF THE INVENTION

This invention relates to flash memory devices and, more particularly, to a method for identifying a flash memory device page size and data bus size and a related hosting device.

BACKGROUND OF THE INVENTION

Flash memory devices, for example, NAND flash memory devices, are generally accessed via a two-way 8-bit or 16-bit I/O bus. NAND-flash devices are not accessed in the same manner as other general memory devices. Reading the NAND-flash memory typically requires that the host system know the page size and the I/O bus size of the NAND-flash memory device connected to it.

Generally, the NAND-flash memory is organized as an array having a plurality of blocks. Small sized NAND-flash devices may have a capacity of 8 MB, 16 MB, 32 MB, or 64 MB. A large sized NAND-flash devices may have a capacity of 128 MB, 256 MB, 512 MB, or 1 GB. In small sized NAND-flash devices, each block comprises 16 pages and each page is divided into a data area of 512 bytes and a spare area of 16 bytes. In large sized NAND-flash devices, each block comrpises 64 pages, and each page is divided into a data area of 2048 bytes and a spare area of 64 bytes. If the host microprocessor system is unable to correctly recognize the installed NAND-flash, accessing of data in the NAND-flash may be impossible.

Typically, the read access and the write access take place at the page level, with a "page" being a memory area of 512 bytes (in case of Small Page architecture), 2048 bytes (in case of Large Page architecture), or 4096 bytes (in case of Very Large Page architecture). Typically, host systems that utilize NAND-flash devices connected to them identify the type of NAND-flash by utilizing a static device ID look-up table. Unfortunately, this conventional way of identification of the type of NAND-flash device has drawbacks.

A first deficiency with the conventional method of NAND-flash identification is that for host systems to be able to utilize NAND-flash of new characteristics, as new vendors as well as long established vendors release memory devices of new sizes and specifications, the system updates its device ID look-up table with the newest releases of NAND-flash products. Updating the device ID look-up table represents a non-trivial maintenance effort of the host system.

An attendant drawback with the conventional NAND-flash identification method becomes evident as more vendors release newer NAND-flash products that forces static device ID look-up tables that contain the NAND-flash ID list to continually grow because identification information about new commercial NAND-flash devices is continually added. Accordingly, larger memory capacities are allocated to the static device ID look-up tables.

Normally, the static device ID table is stored in the BOOT code or in on-chip RON code. Storing the static device ID table in BOOT code or in on-chip ROM code is per se a costly configuration operation, made even more complicated by the fact that static device ID tables are becoming larger and larger. A flexible access method for a large number of types of NAND flash memory devices is desirable. Preferably, such an access method should be capable of supporting future types of memory chips without updating hardware.

U.S. Patent Application Publication No. 2005/0180206 to Randell et al discloses a technique for identifying whether a NAND flash memory device is accessible through a 8-bit or a 16-bit bus without reading the identification code of the device. Nothing on the use of knowing the page size of the memory device is disclosed, least of all of, an ability of identifying the size without knowing it from recorded data.

In an attempt to provide an approach to this deficiency, U.S. Patent Application Publication No. 2007/0061498 to Chua et al. discloses a method of identifying a NAND flash memory device without reading its identification code. The method comprises reading at least a whole memory page as if the memory device had a certain page size and was accessible through a data bus of a certain size (8-bit or 16-bit), and if a certain identification pattern (already stored in the memory) is correctly read, then the memory device has that certain page size and is accessible through a data bus of that certain size, otherwise trying with another combination of page size and data bus size.

Theoretically, this method is effective but burdensome because it uses reading data of a whole memory page plus at least another 32 bytes of data in order to locate the page boundary, for each trial combination, and eventually repeating the same trial process until the correct combination of supposed page size of the memory and data bus size is struck.

Moreover, the disclosure is silent about the way the spare areas of the memory device are accounted for. It is not explained if and how the disclosed method would recognize the page size and the data bus size of a NAND flash memory device should the read memory page contain failed memory cells.

SUMMARY OF THE INVENTION

In view of the foregoing background, it is therefore an object of the present invention to provide method is for identifying a flash memory device coupled to a host device that is efficient.

This and other objects, features, and advantages in accordance with the present invention are provided by a method is for identifying a flash memory device coupled to a host device. The flash memory device may have a page size from a plurality of possible page sizes, bootstrap code stored on a first sector thereof, and a data bus for accessing data stored thereon and with a data bus size from a plurality of possible data bus sizes. The method may include reading the bootstrap code stored in a first page of the first sector as if the flash memory device had an assumed page size and an assumed data bus size, reading content from memory locations where error correction code (ECC) bytes of the first page are stored if the flash memory device has the assumed page size and checking whether the ECC bytes include more than a number of errors associated with the assumed page size, and if the ECC bytes do not include more than the number of errors, generating a signal that the flash memory device has the assumed page size and the assumed data bus size. Advantageously, the flash memory device is identified without using a static device ID look-up table.

For example, the flash memory device may comprise a NAND flash memory device. Furthermore, the page size and the data bus size may be identified without reading identification code from the flash memory device.

In some embodiments, the number of errors may be one or eight. Also, the reading of the bootstrap code stored in the first page of the first sector is based upon a number of bytes of data of the first page corresponding to a page of data of a Small Page memory device.

For example, the page size may be based upon a Large Page size and the data bus size may comprise 8 bits. Also, the method may further comprise if a logic high output signal is generated, generating signals for identifying the flash memory device as having the page size and the data bus size, otherwise if not all combinations of the possible page sizes and the possible data bus sizes have been tried, executing for a different combination of possible page size and possible data bus size and repeating the generating of the signals for identifying the memory if the logic high output signal is generated, otherwise generating signals for indicating that the flash memory device has not been identified.

More specifically, the plurality of possible page sizes may include a Large Page size, a Very Large Page size, and a Small Page size, and the plurality of possible data bus sizes may include 8-bit and 16-bit.

Moreover, the method may further comprise verifying whether two nonconsecutive bytes of the bootstrap code are correct, and if not, generating a signal indicating that the flash memory device does not have the assumed page size and the assumed data bus size, otherwise executing at least reading content of memory locations where ECC bytes of the first page are stored if the flash memory device has the assumed page size and checking whether the ECC bytes include more than the number of errors, and if the ECC bytes do not include more than the number of errors, generating the signal indicating that the NAND flash memory device has the assumed page size and the assumed data bus size. For example, the two nonconsecutive bytes may be the first and the third bytes.

Another aspect is directed to a host device coupled to a flash memory device. The flash memory device may have a page size from a plurality of possible page sizes, bootstrap code stored on a first sector thereof, and a data bus for accessing data stored thereon and with a data bus size from a plurality of possible data bus sizes. The host device may include a memory, and a processor cooperating with the memory for reading data stored in a first page of the first sector as if the flash memory device had an assumed page size and an assumed data bus size. The processor may also be for reading content from memory locations where error correction code (ECC) bytes of the first page are stored if the flash memory device has the assumed page size and checking whether the ECC bytes include more than a number of errors associated with the assumed page size, and if the ECC bytes do not include more than the number of errors, generating a signal that the flash memory device has the assumed page size and the assumed data bus size.

DETAILED DESCRIPTION OF THE PREFERRED EMBODIMENTS

Figure 1:
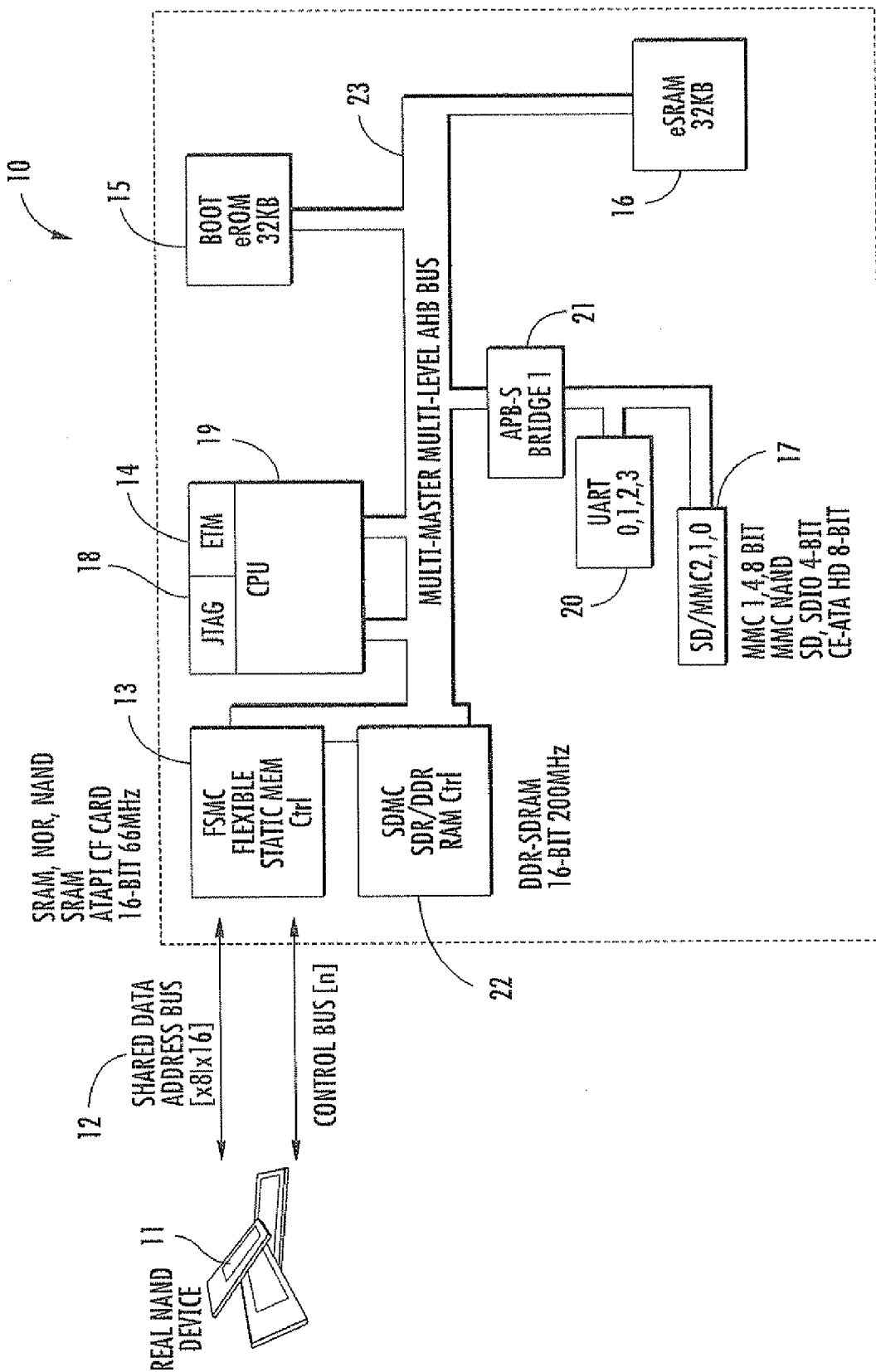
FIG. 1 illustrates a schematic diagram of a hosting device coupled to a flash memory device, according to the present invention.
Figure 2:
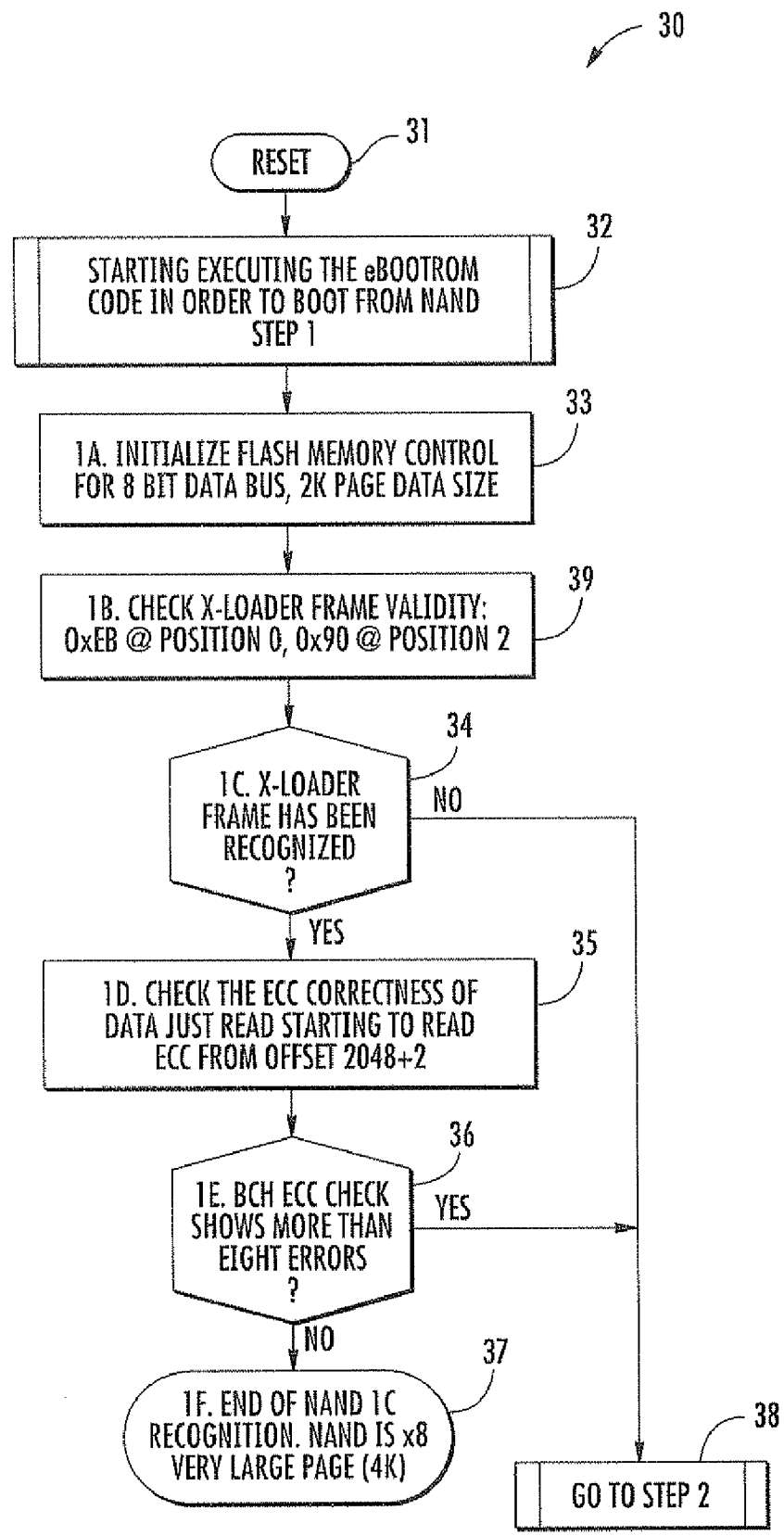
FIGS. 2 to 7 include flowcharts illustrating a method for identifying a flash memory device coupled to a host computing device, according to the present invention.
Figure 3:
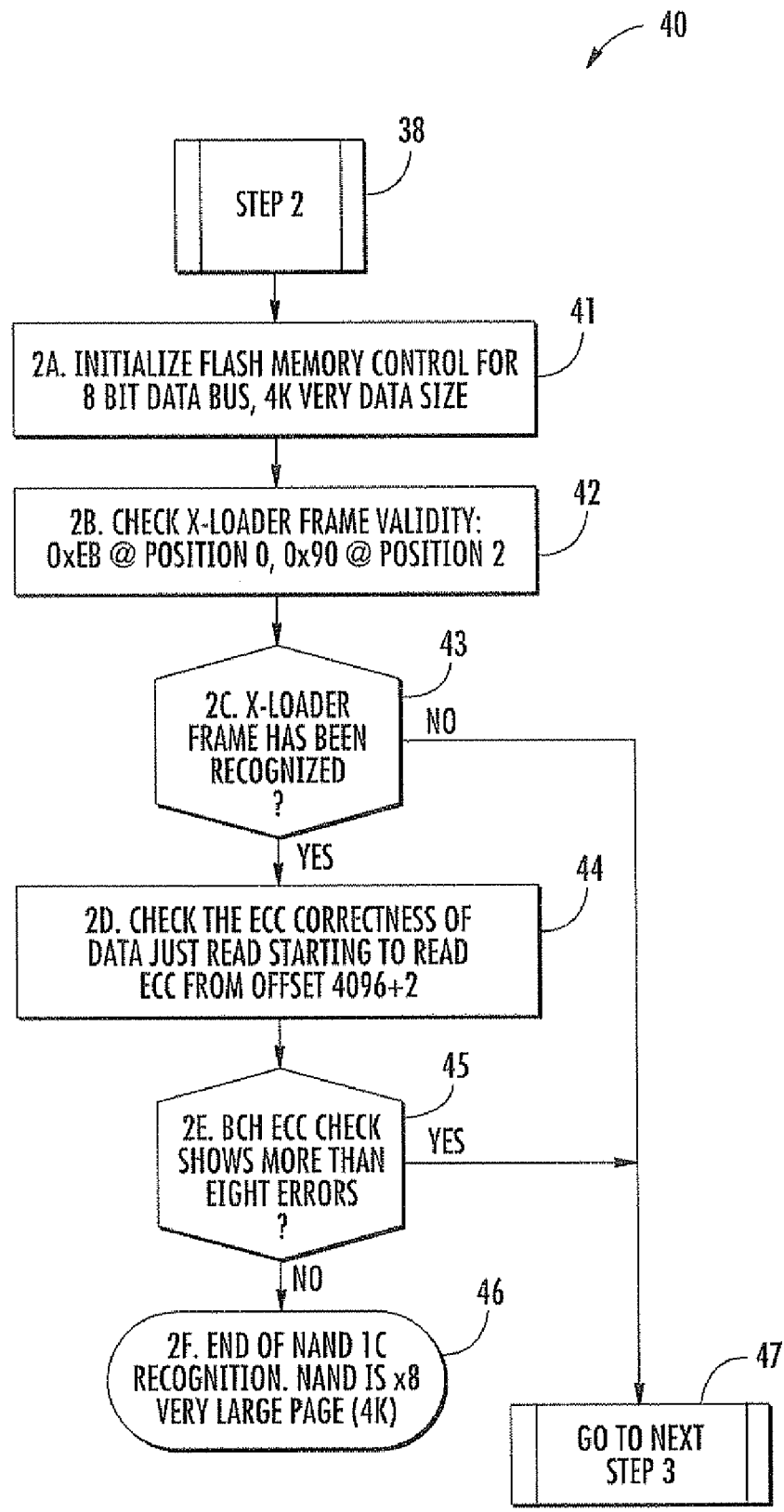
Figure 4:
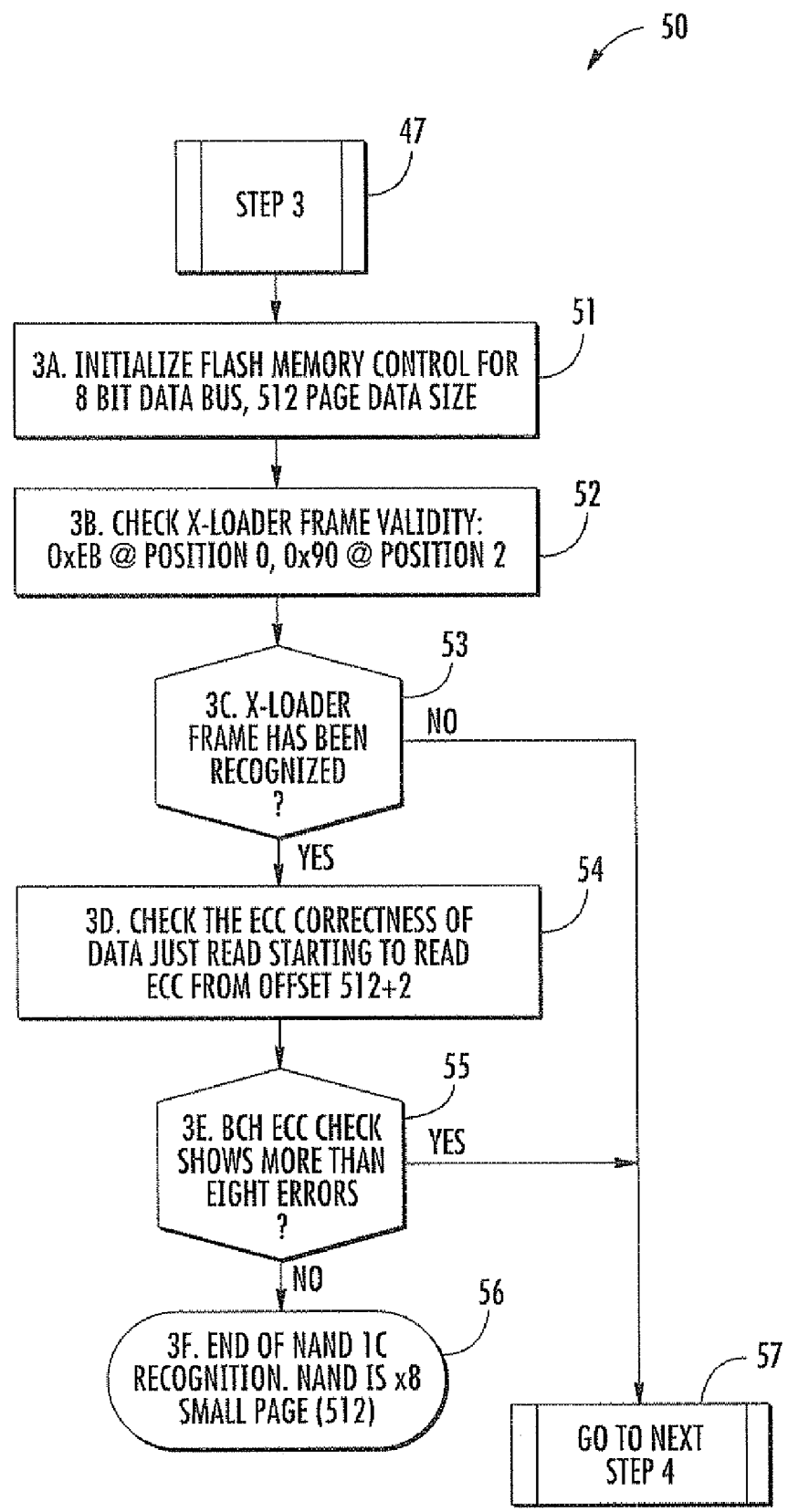
Figure 5:
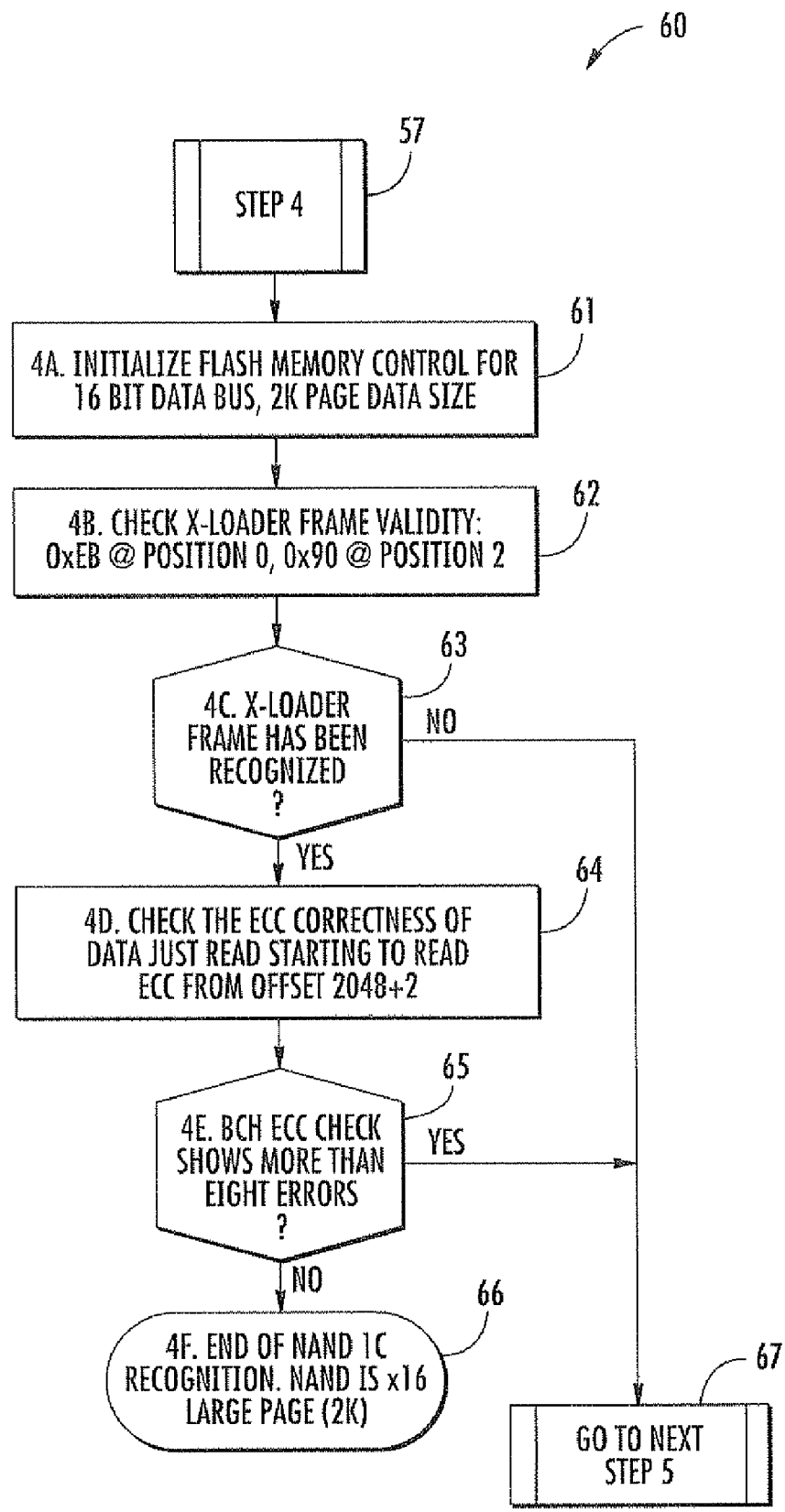
Figure 6:
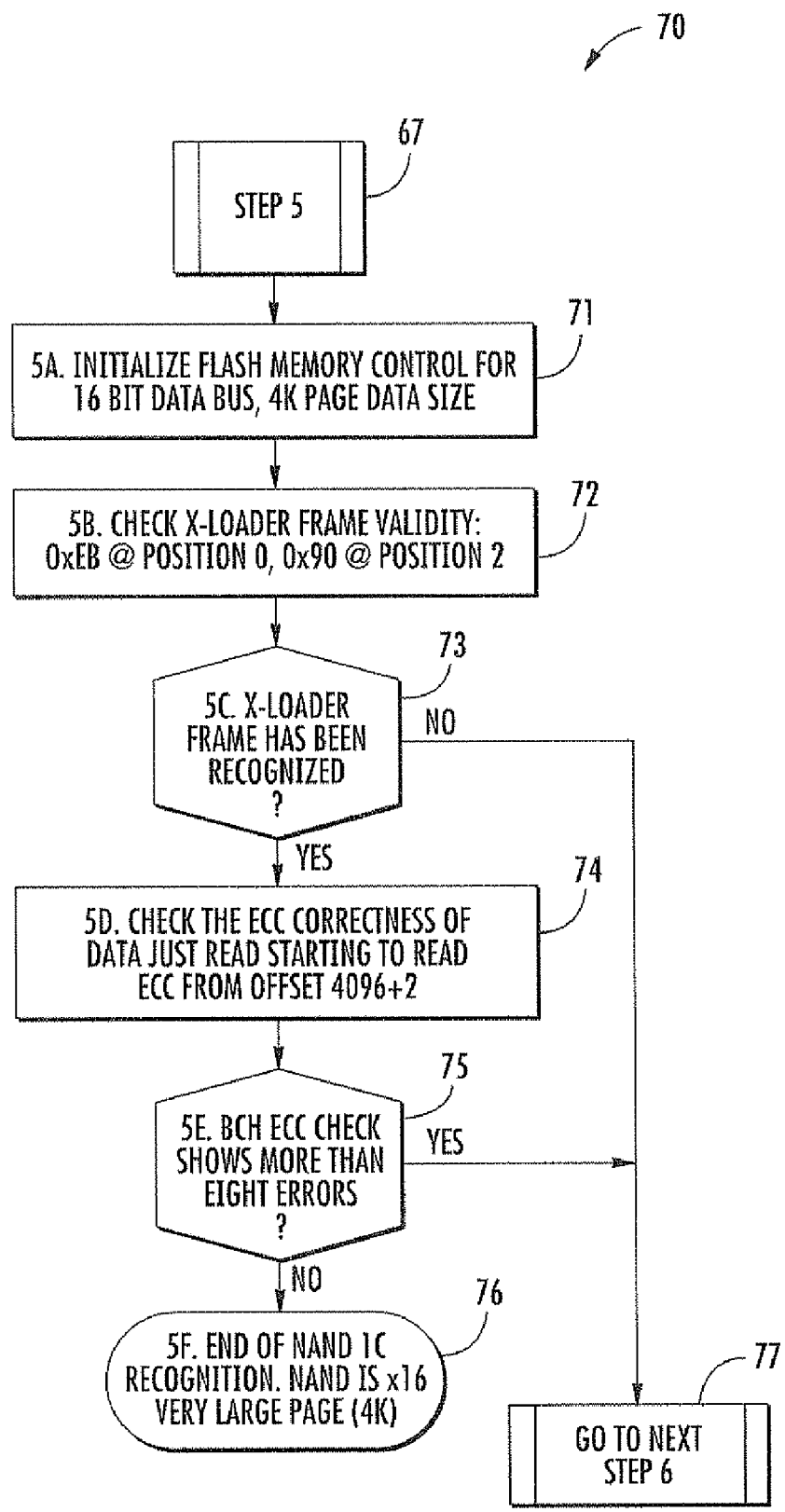
Figure 7:
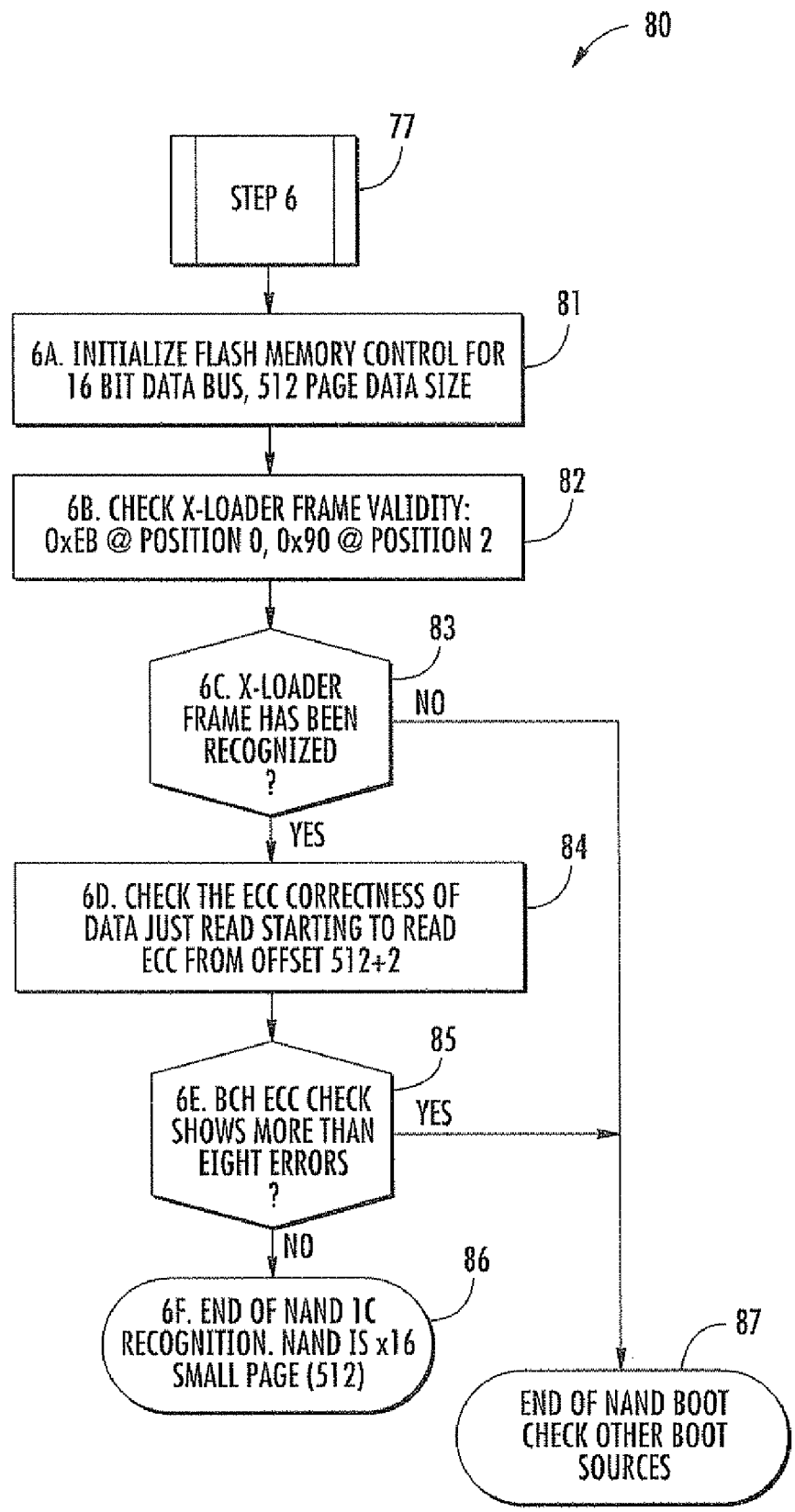

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

A reliable and less burdensome method in now disclosed that, implemented in a microprocessor host system of an externally connected NAND flash memory device, allows recognition of the type of architecture (page size) of the connected memory and the size of the data bus through which it is accessed. Substantially, a procedure is repeated for every combination of possible memory page sizes and data bus sizes until the correct combination is struck.

According to this procedure, the memory is accessed supposing that it has a certain page size chosen from prefigured sets of possible page sizes and of possible data bus sizes for accessing the content of the memory. With a blindly chosen combination of assumed page and data bus sizes, a pre-established number of bytes of data are read from the first page of the memory. This is possible because all NAND flash memory devices are sold with a pre-established bootstrap code stored by manufacturers in the first sector of the memory, thus there are bytes of data already written in the memory.

It is then checked whether or not supposedly error correction codes (ECC) bytes, read at memory locations where for the assumed page size would be storing bytes of ECC of the first memory page, are coherent with the read data by revealing not more than a maximum pre-established number of errors. If so, the memory is recognized as having the assumed page size and data bus size, otherwise the memory device is not recognized as corresponding to the assumed combination and a different presumable combination of page size and/or data bus size is tried.

The memory may be accessed supposing that it has a certain page size belonging to the group comprising, for example, Large Page, Very Large Page and Small Page architectures, and a data bus for accessing the content of the memory of either 8 bits or 16 bits. The above procedure, carried out for any first presumed combination of page and data bus sizes, is eventually repeated for a different combination until either the correct combination is identified or all the six prefigured combinations have been tried. If none of the combinations matches, the memory device may not be recognized. It is evident that the set of presumed combinations may be easily expanded to cater for new NAND flash memory devices that could be released by manufacturers.

According to an embodiment, a block of 512 bytes of data and the supposedly relative ECC bytes are read from the first page of the memory in the assumed page size of the NAND flash memory device, thus limiting the burden of the trial steps even if a page size larger than 512 bytes is assumed. According to another embodiment, an optional preliminary go/not go step may be included. Accordingly, two nonconsecutive bytes of data stored in the first sector, preferably the first and the third byte of the bootstrap code, are read supposing that the memory device has a certain page size, chosen, for example, among Large Page, Very Large Page and Small Page architectures, and a data bus for accessing the content of the memory of a certain size chosen, for example, between 8 bits and 16 bits. If these two bytes or other pairs of nonconsecutive bytes of a typical bootstrap code are not read correctly, the memory device is taken as not having the assumed combination, and such a preliminary step is repeated changing the assumed size of the data bus.

Having thus identified a correct data bus size, the same procedure of reading a pre-established number of bytes of data on the first page and of verifying coherence with supposedly corresponding ECC bytes is performed for the first assumed page size and eventually repeated for the different page sizes. The maximum number of errors used for verifying correctness or incorrectness of an assumed architectural combination according to the trial procedure of this method may correspond to the maximum number of errors that can be corrected with a common ECC algorithm. Generally, this number is tied to the page size of the memory device. For example, for a Small Page NAND flash memory device, the maximum correctable number of errors commonly is one, and for a Large or Very Page NAND flash memory device, the maximum correctable number of errors commonly is eight.

Referring now to FIG. 1, a host device, for example, the illustrated microprocessor host system 10, for implementing the method disclosed herein is now described. As illustrated, the host system 10 is coupled to a flash memory device, for example, the illustrated NAND flash memory device 11. The host system 10 communicates with the NAND flash memory device 11 via a shared data communications bus 12.

The meaning of each label is made clear in the following table:

| FSMC | Flexible Static Memory Controller 13 |
|---|---|
| JTAG | Debugger Access Port 18 |
| ETM | Embedded Trace MacroCell 14 |
| CPU | Central Processing Unit 19 |
| Boot eROM | Embedded Boot Read Only Memory 15 |
| APB-S | Advanced Peripheral Bus - Subsystem 21 |
| UART | Universal Asynchronous Receiver Transmitter 20 |
| SD/MMC | Secure Digital Multimedia Card Controller Interface 17 |
| ESRAM | Embedded Static Random Access Memory 16 |
| NOR | Non Volatile Computer Memory |
| SDRAM | Synchronous Dynamic Random Access Memory |
| SD MMC | Secure Digital MultiMedia Card |

The NAND flash memory device 11 is connected to the host system 10 through a data bus 12 having a size of, for example, 8 bits, 16 bits, or larger. The host system 10 has a software code stored in the Boot ROM 15 for booting the system at start-up. The main objective of this software code is to authenticate, to load into the internal SRAM 16, and to execute an application, conventionally referred to as "X-Loader". The application "X-Loader" may be stored in the external NAND flash memory device 11 connected to the system and substantially includes a bootstrap code that allows the system to boot up and download a customer application code into SDRAM.

Using this method, it is possible to determine the page size of the NAND flash memory device 11 and the size of the data bus 12 for accessing the memory without reading the identification code of the device. Therefore, with the disclosed method, it is not necessary to update a look-up table with identification codes of all marketed NAND flash memory devices.

The data written in the NAND flash memory device 11 is read as if the memory had an assumed page size, belonging to a prefigured group of possible sizes, and a data bus 12 of an assumed size belonging to a prefigured group of possible sizes. The content of memory locations where ECC (Error Correction Code) bytes of the first memory page would be stored, if the memory had the assumed page size and data bus size, are examined to determine if they are incoherent or whether they are not corresponding data for the first memory page. This determination is based upon revealing more than a maximum pre-established number of errors. If not, the page size and the data bus size have been identified, otherwise a different possible combination of page size and data bus size is to be tried.

This method is faster than the method disclosed in U.S. Patent Application Publication No. 2005/0180206 to Randell et al., because the former reads only at most one page and the ECC bytes of the same memory page and not one memory page plus at least another 32 bytes of data to locate page boundaries. Moreover, differently from the typical method, the sole requirement is that the NAND flash memory device be programmed with its bootstrap code, that is already done by manufacturers. Therefore, differently from the prior method, it is not necessary to write in the memory and to recognize a whole page of data uniquely dedicated to identify the NAND flash memory device.

According to a particularly advantageous embodiment, only 512 bytes of data and the corresponding ECC bytes are read from the first memory page. In practice, with this advantageous embodiment, a number of bytes equal to a memory page of data of a Small Page architecture is always read, independently from the effective page size of the NAND flash memory device 11.

According to another embodiment, two nonconsecutive bytes of the first memory sector are accessed: if they are not correctly read, it means that the memory device does not have the assumed combination of page size and data bus size. If the two nonconsecutive bytes are correctly read, then the supposed ECC bytes are read along with the corresponding data page as stated above.

The two nonconsecutive bytes to be read are preferably, but not necessarily, the first and the third bytes stored in the first memory sector. This choice is convenient because these two bytes are the first nonconsecutive bytes of the memory. The pre-established maximum number of errors that may be detected by ECC bytes depends in general on the page size of the NAND flash memory device 11. For example, in Small Page architectures, the maximum number of errors that may be corrected using ECC bytes is one. In Large Page architectures, the maximum number of errors is eight.

Referring now to FIGS. 2-7, flowcharts 30, 40, 50, 60, 70, 80 illustrate an exemplary embodiment of a method for identifying the page size and the data bus size of a NAND flash memory device 11 connected to a microprocessor host system 10. As will be appreciated by those skilled in the art, it is evident that, according to this particular embodiment of the disclosed method, the same operations are repeated for each possible combination of page size of the NAND flash memory device 11 and data bus size until the correct combination is identified. The method beings with Block 31 and the steps executed by the above microprocessor system 10 are:

1. Connect the NAND flash memory 11 to the hosting device 10, either with 8 bit or 16 bits data bus 12

2. Start the ROM code in order to recognize the NAND and boot from the flash devices (Block 32).

3. Initialize the FSMC controller for 8-bit, 2 Kilobyte page size memories (NAND Large Page @ 8 bit) (Block 33).

4. Check the X-Loader frame validity at the beginning of the first 512 bytes of the first sector (Block 39).

5. If a first check on the X-Loader is NOT passed (checking both the first and the third byte that should be 0xEB|E9 and 0x90 and the reserved sectors value that should be different from ZERO), proceed to Block 34.

6. If checking that the 13 bytes ECC code at position 2048+2 shows no more than 8 errors, then the flash memory device 11 has been identified (Blocks 35-37).

7. Else, initialize the FSMC controller for 8-bit, 4 KByte page size memories (NAND Very Large Page @ 8 bit) (Blocks 38 & 41).

8. Check the X-Loader frame at the beginning of the first 512 bytes of the first sector (Block 42).

9. If a first check on the X-Loader is NOT passed, skip next point (Block 43).

10. If checking that the 13 bytes ECC code at position 4096+2 shows no more than 8 errors, then the flash memory device 11 has been identified (Blocks 44-46).

11. Else, initialize the FSMC controller for 8-bit, 512 bytes page size memories (NAND Small Page @ 8 bit) (Blocks 47 & 51).

12. Check the X-Loader frame validity at the beginning of the first 512 bytes of the first sector (Block 52).

13. If a first check on the X-Loader is NOT passed, skip next point (Block 53).

14. If checking that the 13 bytes ECC code at position 512+2 shows no more than 8 errors, then the flash memory device 11 has been identified (Blocks 54-56).

15. Else, initialize the FSMC controller for 16-bit, 2 KByte page size memories (NAND Large Page @ 16 bit) (Blocks 57 & 61).

16. Check the X-Loader frame at the beginning of the first 512 bytes of the first sector (Block 62).

17. If a first check on the X-Loader is NOT passed, skip next point (Block 63).

18. If checking that the 13 bytes ECC code at position 2048+2 shows no more than 8 errors, then the flash device has been identified (Blocks 64-66).

19. Else, initialize the FSMC controller for 16-bit, 4 KByte page size memories (NAND Very Large Page @ 16 bit) (Blocks 67 & 71).

20. Check for the X-Loader frame at the beginning of the first 512 bytes of the first sector (Block 72).

21. If a first check on the X-Loader is NOT passed, skip next point (Block 73).

22. If checking that the 13 bytes ECC code at position 4096+2 shows no more than 8 errors, then the flash memory device 11 has been identified (Blocks 74-76).

23. Else, initialize the FSMC controller for 16-bit, 512 bytes page size memories (NAND Small Page @ 16 bit) (Blocks 77 & 81).

24. Check the X-Loader frame at the beginning of the first 512 bytes of the first sector (Block 82).

25. If a first check on the X-Loader is NOT passed, skip next point (Block 83).

26. If checking that the 13 bytes ECC code at position 512+2 shows no more than 8 errors, then the flash memory device 11 has been identified (Blocks 84-86).

27. Otherwise {flash_NOT_FOUND}, the flash memory device 11 cannot be identified and the method ends at Block 87.

A method, implemented in a microprocessor host system, is for generating a flag upon recognizing whether or not a NAND flash memory device having a bootstrap code written in a first sector thereof, connected to the host system has a certain page size belonging to a prefigured group of possible sizes and a data bus for accessing the content of the memory of a certain size belonging to a prefigured group of possible sizes. The method may be implemented without reading any identification code (deviceID) of the memory device. The method includes the steps of a) reading data written in a first page of the first memory sector as if the memory had an assumed page size and data bus size and executing the following steps d1) reading the content of memory locations where ECC bytes of the first page would be contained if the memory had the assumed page size and checking whether or not the supposedly ECC bytes reveal more than a pre-established number of errors; and d2) if not, generating a flag acknowledging that the memory has the assumed page size and data bus size.

In another emobidment, the NAND flash memory device has a certain page size belonging to the group comprising Large Page, Very Large Page and Small Page, and a data bus for accessing the content of the memory of a certain size belonging to the group comprising 8-bit and 16-bit sizes.

Another aspect is directed to a method, implemented in a microprocessor host system, for generating a flag upon recognizing whether or not a NAND flash memory device having a bootstrap code written in a first sector thereof, connected to the host system has a certain page size belonging to a prefigured group of possible sizes and a data bus for accessing the content of the memory of a certain size belonging to a prefigured group of possible sizes, without reading any identification code (deviceID) of the memory device.

This method includes the steps of: a) reading data written in a first page of the first memory sector as if the memory had an assumed page size and data bus size; b) verifying whether two nonconsecutive bytes of the bootstrap code are correct; c) if not, generating a flag acknowledging that the memory does not have the assumed page size and data bus size, otherwise executing the following steps: d1) reading the content of memory locations where ECC bytes of the first page would be contained if the memory had the assumed page size and checking whether or not the supposedly ECC bytes reveal more than a pre-established number of errors; d2) if not, generating a flag acknowledging that the memory has the assumed page size and data bus size.

Another aspect is directed to a method, implemented in a microprocessor host system, for generating a flag upon recognizing whether or not a NAND flash memory device having a bootstrap code written in a first sector thereof, connected to the host system has a certain page size belonging to the group comprising Large Page, Very Large Page and Small Page, and a data bus for accessing the content of the memory of a certain size belonging to the group comprising 8-bit and 16-bit, without reading the identification code (deviceID) of the memory.

This method includes the steps of: a) reading data written in a first page of the first memory sector as if the memory had an assumed page size and data bus size; b) verifying whether two nonconsecutive bytes of the bootstrap code are correct; c) if not, generating a flag acknowledging that the memory does not have the assumed page size and data bus size, otherwise executing the following steps: d1) reading the content of memory locations where ECC bytes of the first page would be contained if the memory had the assumed page size and checking whether or not the supposedly ECC bytes reveal more than a pre-established number of errors; d2) if not, generating a flag acknowledging that the memory has the assumed page size and data bus size.

For example, the two nonconsecutive bytes may be the first and the third. In some embodiments, the pre-established number of errors is one or eight. Also, step a) may be carried out on a number of bytes of data of the first memory page corresponding to a page of data of a Small Page memory device.

Another aspect is directed to a method, implemented in a microprocessor host system, for generating identification signals of the page size and of the data bus size of a NAND flash memory device having a bootstrap code written in a first sector thereof, connected to the host system. The memory device may have a certain page size belonging to a prefigured group of possible sizes and a data bus for accessing the content of the memory of a certain size belonging to a prefigured group of possible sizes, without reading any identification code (deviceID) of the memory device.

This method may comprise the steps of: a) executing the methods described above where the page size is relative to the Large Page and the certain data bus size is 8 bits, and b) if a logically high output signal is generated, generating the identification signals for identifying the memory as having the page size and data bus size, else c1) if not all combinations of possible page sizes and data bus size have been tried, executing the method of claim 1 or 3 for a different combination of page size and data bus size and repeating step b), else c2) generating the identification signals for acknowledging that the memory device has not been identified.

Another aspect is directed to a method, implemented in a microprocessor host system, for generating identification signals of the page size and of the data bus size of a NAND flash memory device having a bootstrap code written in a first sector thereof, connected to the host system. The memory device has a certain page size belonging to the group comprising Large Page, Very Large Page and Small Page, and a data bus for accessing the content of the memory of a certain size belonging to the group comprising 8-bit and 16-bit, without reading the identification code (deviceID) of the memory.

The method may include the steps of: a) executing the method described above, wherein the page size is relative to the Large Page and the certain data bus size is 8 bits; b) if a logically high output signal is generated, generating the identification signals for identifying the memory as having the page size and data bus size, else c1) if not all combinations of possible page sizes and data bus size have been tried, executing the above described method for a different combination of page size and data bus size and repeating step b), else c2) generating the identification signals for acknowledging that the memory device has not been identified.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. A method for identifying a flash memory device coupled to a host device, the flash memory device having a page size from a plurality of possible page sizes, bootstrap code stored on a first sector thereof, and a data bus for accessing data stored thereon and with a data bus size from a plurality of possible data bus sizes, the method comprising:
reading the bootstrap code stored in a first page of the first sector as if the flash memory device had an assumed page size and an assumed data bus size; and
verifying whether two nonconsecutive bytes of the bootstrap code are correct, and if not, generating a signal indicating that the flash memory device does not have the assumed page size and the assumed data bus size, otherwise executing at least
reading content from memory locations where error correction code (ECC) bytes of the first page are stored if the flash memory device has the assumed page size and checking whether the ECC bytes include more than a number of errors associated with the assumed page size, and
if the ECC bytes do not include more than the number of errors, generating a signal that the flash memory device has the assumed page size and the assumed data bus size.

2. The method according to claim 1 wherein the flash memory device comprises a NAND flash memory device.

3. The method according to claim 1 wherein the page size and the data bus size are identified without reading identification code from the flash memory device.

4. The method according to claim 1 wherein the number of errors is one.

5. The method according to claim 1 wherein the number of errors is eight.

6. The method according to claim 1 wherein the reading of the bootstrap code stored in the first page of the first sector is based upon a number of bytes of data of the first page corresponding to a page of data of a Small Page memory device.

7. The method according to claim 1 wherein the page size is based upon a Large Page size and the data bus size is 8 bits; and further comprising:
if a logic high output signal is generated, generating signals for identifying the flash memory device as having the page size and the data bus size, otherwise
if not all combinations of the possible page sizes and the possible data bus sizes have been tried, executing for a different combination of possible page size and possible data bus size and repeating the generating of the signals for identifying the memory if the logic high output signal is generated,
otherwise generating signals for indicating that the flash memory device has not been identified.

8. The method according to claim 1 wherein the plurality of possible page sizes includes a Large Page size, a Very Large Page size, and a Small Page size; and wherein the plurality of possible data bus sizes includes 8-bit and 16-bit.

9. The method according to claim 1 wherein the two nonconsecutive bytes are the first and the third bytes.

10. A method for operating a microprocessor host system to generate a flag signal upon recognizing a NAND flash memory device with a bootstrap code in a first sector thereof, the NAND flash memory device being connected to the microprocessor host system and having a page size belonging to a group of possible page sizes and a data bus for accessing content stored in the NAND flash memory device and having a data bus size belonging to a group of possible data bus sizes without reading identification code from the NAND flash memory device, the method comprising:
reading data written in a first page of the first sector as if the NAND flash memory device had an assumed page size and an assumed data bus size; and
verifying whether two nonconsecutive bytes of the bootstrap code are correct, and if not, generating a signal indicating that the NAND flash memory device does not have the assumed page size and the assumed data bus size, otherwise executing at least
reading content of memory locations where error correction code (ECC) bytes of the first page are stored if the NAND flash memory device has the assumed page size and checking whether the ECC bytes include more than a pre-established number of errors, and
if the ECC bytes do not include more than the pre-established number of errors, generating the flag signal that the NAND flash memory device has the assumed page size and the assumed data bus size.

11. The method according to claim 10 wherein the pre-established number of errors is one.

12. The method according to claim 10 wherein the pre-established number of errors is eight.

13. The method according to claim 10 wherein the reading of the data written in the first page of the first sector is carried out on a number of bytes of data of the first page corresponding to a page of data of a Small Page memory device.

14. The method according to claim 10 wherein the page size is based upon a Large Page size and the data bus size is 8 bits; and further comprising:
if a logic high output signal is generated, generating identification signals for identifying the NAND flash memory device as having the page size and the data bus size, otherwise
if not all combinations of the possible page sizes and the possible data bus sizes have been tried, executing for a different combination of possible page size and possible data bus size and repeating the generating of the identification signals for identifying the memory if the logic high output signal is generated,
otherwise generating identification signals for indicating that the NAND flash memory device has not been identified.

15. The method according to claim 10 wherein the group of possible page sizes includes a Large Page size, a Very Large Page size, and a Small Page size; and wherein the group of possible data bus sizes includes 8-bit and 16-bit.

16. The method according to claim 10 wherein the two nonconsecutive bytes are the first and the third bytes.

17. The method according to claim 10 wherein the page size is based upon a Large Page; wherein the data bus size is 8 bits; and further comprising:
if a logic high output signal is generated, generating identification signals for identifying the NAND flash memory device as having the assumed page size and the assumed data bus size, otherwise
if not all combinations of possible page sizes and possible data bus sizes have been tried, executing for a different combination of possible page sizes and possible data bus sizes and repeating the generating of the identification signals for identifying the memory if the logic high output signal is generated, otherwise generating identification signals for indicating that the NAND flash memory device has not been identified.

18. A host device to be coupled to a flash memory device, the flash memory device having a page size from a plurality of possible page sizes, bootstrap code stored on a first sector thereof, and a data bus for accessing data stored thereon and with a data bus size from a plurality of possible data bus sizes, the host device comprising:
a memory;
a processor cooperating with said memory and configured to
read the bootstrap code stored in a first page of the first sector as if the flash memory device had an assumed page size and an assumed data bus size, and
verify whether two nonconsecutive bytes of the bootstrap code are correct, and if not, generating a signal indicating that the flash memory device does not have the assumed page size and the assumed data bus size, otherwise executing at least
read content from memory locations where error correction code (ECC) bytes of the first page are stored if the flash memory device has the assumed page size and checking whether the ECC bytes include more than a number of errors associated with the assumed page size, and
if the ECC bytes do not include more than the number of errors, generate a signal that the flash memory device has the assumed page size and the assumed data bus size.

19. The host device according to claim 18 wherein the flash memory device comprises a NAND flash memory device.

20. The host device according to claim 18 wherein the page size and the data bus size are identified without reading identification code from the flash memory device.

21. The host device according to claim 18 wherein the number of errors is one.

22. The host device according to claim 18 wherein the number of errors is eight.

* * * * *